(12) United States Patent
Yang et al.

(10) Patent No.: US 12,128,395 B2
(45) Date of Patent: Oct. 29, 2024

(54) PROCESS APPARATUS INCLUDING GAS SUPPLIER AND METHOD OF OPERATING THE SAME

(71) Applicant: Samsung Electronics Co., Ltd., Suwon-si (KR)

(72) Inventors: Dongsik Yang, Seoul (KR); Hyukjae Kwon, Suwon-si (KR); Minseok Koo, Suwon-si (KR); Sukeun Kuk, Suwon-si (KR); Sehyeong Oh, Seoul (KR); Hyun Chul Lee, Hwaseong-si (KR); Sangmin Ji, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 501 days.

(21) Appl. No.: 17/411,640

(22) Filed: Aug. 25, 2021

(65) Prior Publication Data
US 2022/0243334 A1 Aug. 4, 2022

(30) Foreign Application Priority Data

Feb. 3, 2021 (KR) .................. 10-2021-0015650

(51) Int. Cl.
*C23C 16/52* (2006.01)
*B01J 7/00* (2006.01)
*C23C 16/448* (2006.01)
*H01L 21/67* (2006.01)

(52) U.S. Cl.
CPC .............. *B01J 7/00* (2013.01); *C23C 16/448* (2013.01); *C23C 16/4481* (2013.01); *H01L 21/67017* (2013.01); *H01L 21/67253* (2013.01)

(58) Field of Classification Search
CPC ...... B01J 7/00; C23C 16/4481; C23C 16/448; H01L 21/67017; H01L 21/67253
See application file for complete search history.

(56) References Cited

U.S. PATENT DOCUMENTS

| 5,108,983 | A | * | 4/1992 | Lackey, Jr. .............. B05D 1/60 |
| | | | | 505/704 |
| 5,925,189 | A | * | 7/1999 | Nguyen .............. C23C 16/4481 |
| | | | | 118/726 |
| 5,990,358 | A | | 11/1999 | Knuth et al. |
| 8,030,526 | B2 | | 10/2011 | Hooker et al. |
| 8,459,290 | B2 | | 6/2013 | Minami et al. |

(Continued)

FOREIGN PATENT DOCUMENTS

| CN | 108970429 A | 12/2018 |
| JP | 2004331407 A | 11/2004 |

(Continued)

*Primary Examiner* — Frederick C Nicolas
(74) *Attorney, Agent, or Firm* — CANTOR COLBURN LLP (57) ABSTRACT

A process apparatus includes a gas supplier which supplies a reaction gas having a constant concentration, and a processor which performs a predetermined process by the reaction gas supplied from the gas supplier, where the gas supplier includes a reactor which accommodates a solid phase reactant, a heater which applies heat to the solid phase reactant to convert the solid phase reactant to a reaction gas in a gas phase, a gas pump which applies a predetermined pumping pressure to the reactor, and a gas outlet which discharges the reaction gas to the processor.

12 Claims, 7 Drawing Sheets

(56) References Cited

U.S. PATENT DOCUMENTS

| | | | |
|---|---|---|---|
| 8,557,460 B2 | 10/2013 | Lucka et al. | |
| 8,800,589 B2 | 8/2014 | Minami et al. | |
| 9,744,190 B2* | 8/2017 | Tait | A61K 9/007 |
| 10,112,165 B1 | 10/2018 | Grasmeder et al. | |
| 10,179,318 B1 | 1/2019 | Grasmeder et al. | |
| 10,239,810 B2 | 3/2019 | Holmberg | |
| 10,457,634 B2 | 10/2019 | Erlandsson et al. | |
| 10,550,076 B2 | 2/2020 | Erlandsson et al. | |
| 10,655,220 B2* | 5/2020 | Sakaguchi | G05D 11/138 |
| 2007/0189356 A1* | 8/2007 | Pettit | C23C 16/4412 |
| | | | 374/7 |
| 2012/0094483 A1* | 4/2012 | Komiya | C23C 16/45502 |
| | | | 438/653 |
| 2016/0372348 A1* | 12/2016 | Sawachi | C23C 16/45561 |
| 2017/0066650 A1* | 3/2017 | Yogev | B01J 8/085 |
| 2019/0259674 A1* | 8/2019 | Howald | H01L 22/26 |
| 2020/0016560 A1 | 1/2020 | Holmberg et al. | |

FOREIGN PATENT DOCUMENTS

| | | |
|---|---|---|
| JP | 4329116 B2 | 9/2009 |
| JP | 2013159606 A | 8/2013 |
| KR | 100763414 B1 | 10/2007 |
| KR | 101116034 B1 | 4/2012 |

\* cited by examiner

PROCESS APPARATUS INCLUDING GAS SUPPLIER AND METHOD OF OPERATING THE SAME

This application claims priority to Korean Patent Application No. 10-2021-0015650, filed on Feb. 3, 2021, and all the benefits accruing therefrom under 35 U.S.C. § 119, the content of which in its entirety is herein incorporated by reference.

BACKGROUND

1. Field

Embodiments of the invention relate to process apparatuses including a gas supplier and methods of operating the process apparatuses.

2. Description of the Related Art

A process apparatus for general chemical to physical reactions may include a gas supplier for supplying a predetermined gas. A gas supplied to a processor must maintain a constant concentration. To this end, the gas supplier may be provided in a gas cylinder type containing a gas having a constant concentration.

SUMMARY

A gas supplier having a gas cylinder type may occupy a relatively large volume. As a result, problems in fabrication convenience and acceptability convenience may occur.

Accordingly, there is a desire for a gas supplier capable of supplying a constant concentration of a reactive gas while having a relatively small volume.

Provided are process apparatuses including a gas supplier capable of supplying a reactive gas of a constant concentration and methods of operating the process apparatuses including the gas supplier.

Provided are process apparatuses including a gas supplier having a reduced volume and methods of operating the process apparatuses including the gas supplier.

Additional features will be set forth in part in the description which follows and, in part, will be apparent from the description, or may be learned by practice of the presented embodiments of the invention.

According to an embodiment, a process apparatus includes a gas supplier which supplies a reaction gas having a constant concentration, and a processor which performs a predetermined process by the reaction gas supplied from the gas supplier, where the gas supplier includes a reactor which accommodates a solid phase reactant, a heater which applies heat to the solid phase reactant to convert the solid phase reactant to a reaction gas in a gas phase, a gas pump which applies a predetermined pumping pressure to the reactor, and a gas outlet which discharges the reaction gas to the processor.

In an embodiment, the solid phase reactant may include at least one of a solid phase or liquid phase volatile material.

In an embodiment, the process apparatus may further include a concentration measuring unit which measures the constant concentration of the reaction gas discharged from the reactor.

In an embodiment, the process apparatus may further include a controller which controls the pumping pressure of the gas pump, where the controller may control the pumping pressure according to a concentration change of the reaction gas received from the concentration measuring unit.

In an embodiment, the process apparatus may further include a carrier gas supplier which supplies a carrier gas which moves the reaction gas discharged from the reactor to the processor.

In an embodiment, the carrier gas may include at least one of nitrogen, oxygen, and air.

In an embodiment, the process apparatus may further include a first on/off valve which blocks and releases the supply of the carrier gas, and a controller which controls the first on/off valve.

In an embodiment, the reactor may include a pumping gas inlet through which a pumping gas supplied from the gas pump is introduced and a pumping gas outlet through which the pumping gas is discharged.

In an embodiment, the pumping gas outlet may be arranged at a first height from a surface of the reactor on which the heater is disposed, and the heater may be arranged at a second height from the surface of the reactor, and the first height may be greater than the second height.

In an embodiment, the process apparatus may further include a process gas supplier which supplies a predetermined process gas to be mixed with the reaction gas discharged from the reactor.

In an embodiment, the process gas may include at least one of nitrogen, oxygen, and air.

In an embodiment, the process apparatus may further include a second on/off valve which blocks and releases the supply of a process gas, and a controller which controls the second on/off valve.

According to a feature of an embodiment, a method of operating a process apparatus including a gas supplier, the method includes placing a solid phase reactant in a reactor, generating a reaction gas by applying heat to the solid phase reactant, supplying a carrier gas inside the reactor, applying a pumping pressure to an inside of the reactor by operating a gas pump, and transferring the reaction gas to a processor.

In an embodiment, the method may further include measuring a concentration of the reaction gas, and controlling the pumping pressure according to a change of the concentration of the reaction gas.

In an embodiment, the method may further include supplying a process gas to be mixed with the reaction gas discharged from the reactor and transferred to the processor.

In an embodiment, the solid phase reactant may include at least one of a solid phase or liquid phase volatile material.

In an embodiment, the carrier gas may include at least one of nitrogen, oxygen, and air.

In an embodiment, the process gas may include at least one of nitrogen, oxygen, and air.

BRIEF DESCRIPTION OF THE DRAWINGS

The above and other embodiments, features, and advantages of the invention will be more apparent from the following description taken in conjunction with the accompanying drawings, in which.

DETAILED DESCRIPTION

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the drawing figures, to explain features. As used herein, the term "and/or" includes any and all combinations of one or more of the associated listed items. Expressions such as "at least one of," when preceding a list of elements, modify the entire list of elements and do not modify the individual elements of the list.

Hereinafter, process apparatuses including a gas supplier and methods of operating the process apparatuses including a gas supplier in embodiments will be described in detail with reference to the accompanying drawings. In the drawings, widths and thicknesses of layers or regions may be exaggerated for clarity of specification and convenience of explanation. Like reference numerals refer to like elements throughout.

The terms used below are used to illustrate only specific embodiments, and are not intended to limit the technical scope of the invention. The singular forms are intended to include the plural forms as well, unless the context clearly indicates otherwise. In the specification, the terms such as "comprise" or "have" are intended to indicate that there is a feature, number, step, action, component, part, or combination thereof described on the specification, and one or more other features. It is to be understood that the invention does not exclude the possibility of the presence or the addition of numbers, steps, operations, components, components, or a combination thereof.

In the drawings, thicknesses may be enlarged or reduced to clearly represent various layers and regions. The same reference numerals are used to similar portions throughout the specification. In the specification, when a layer, film, region, plane, etc. is referred to as being "on" or "above" another layer, it includes not only the case when the layer, film, region, plane, etc. is "directly on" another element but also the case when there is another element therebetween. In the specification, the terms "first", "second", etc. may be used to describe various elements, but the constituent elements may not be limited by these terms. These terms are only used to distinguish one element from another element.

Even though, in the specification, the terms, such as first and second may be used to describe various constituent elements, components, regions, layers, and/or parts, but these constituent elements, components, regions, layers, and/or parts should not be limited by these terms.

Further, the processes described in the disclosure are not necessarily applied in order. For example, when first and second operations are described, it may be understood that the first operation is not necessarily performed before the second operation.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein. A term such as "unit" may mean a physical element such as a circuit and a processor.

Figure 1:
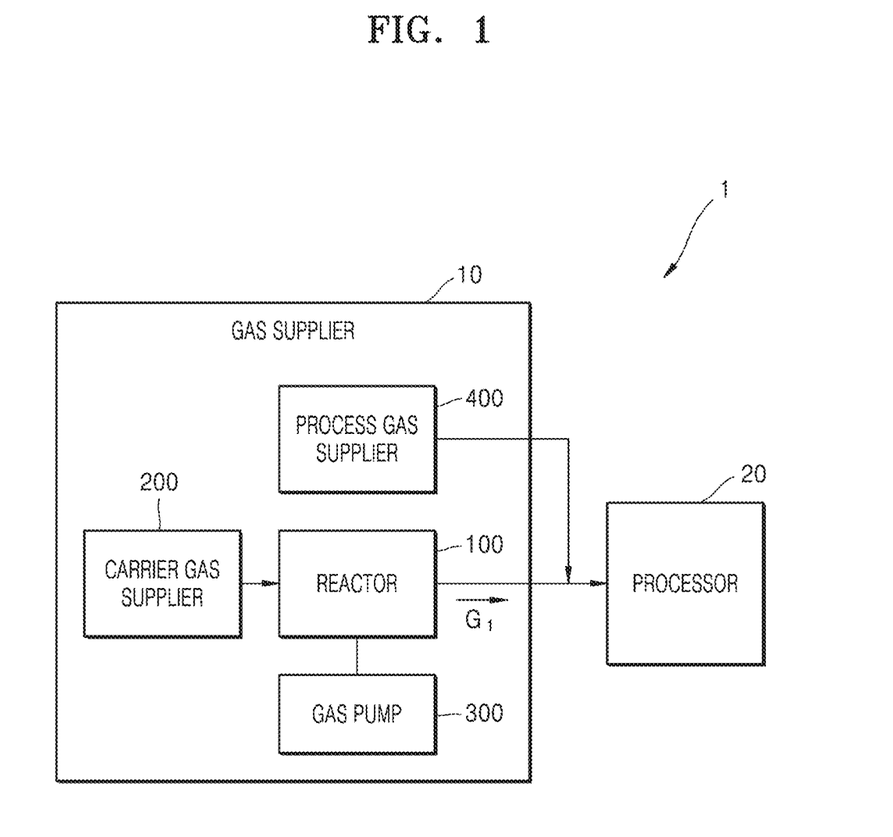
FIG. 1 is a schematic block diagram of an embodiment of a process apparatus including a gas supplier.

FIG. 1 is a schematic block diagram of an embodiment of a process apparatus 1 including a gas supplier.

Referring to FIG. 1, the process apparatus 1 in an embodiment may include a gas supplier 10 which supplies a reaction gas G1 having a constant concentration and a processor 20 which performs a predetermined process by the reaction gas G1 supplied from the gas supplier 10. In an embodiment, the gas supplier 10 may supply a reaction gas G1 in a gas phase by a solid phase reactant M.

The processor 20 is a device capable of performing a physical and chemical process by receiving the reaction gas $G_1$ from the gas supplier 10. In an embodiment, the processor 20 may be used in a production apparatus that performs a semiconductor production process or a display production process, such as an etching process, a deposition process, or the like, by receiving a reaction gas $G_1$ having a constant concentration. Further, the processor 20 may be used in an experimental apparatus that confirms the degree of removal of a contaminant by receiving a reaction gas $G_1$. However, the invention is not limited thereto, and the processor 20 may be applied to any device capable of performing a subsequent process by receiving a reaction gas $G_1$ having a constant concentration.

As described above, in order to continuously supply a reaction gas $G_1$ in a gas phase having a constant concentration to the processor 20, the reaction gas $G_1$ in a gas phase having a constant concentration may be accommodated in the gas supplier 10. In this case, because the reaction gas $G_1$ accommodated in the gas supplier 10 is in a gas phase, the volume of the gas supplier 10 may be greatly increased. The reactant M accommodated in the gas supplier 10 in an embodiment is in a solid phase, and thus, the total volume of the gas supplier 10 may be reduced. In a process of converting the solid phase reactant M to the reaction gas $G_1$ in a gas phase, the concentration of the reaction gas $G_1$ in a gas phase discharged from the gas supplier 10 may not be constant. Hereinafter, the technical feature of converting the solid phase reactant M into a reaction gas $G_1$ in a gas phase and maintaining a constant concentration of the reaction gas $G_1$ in a gas phase discharged from the gas supplier 10 will be described in more detail.

The gas supplier 10 may include a reactor 100, a carrier gas supplier 200, a gas pump 300 and a process gas supplier 400. The reactor 100, the carrier gas supplier 200, the gas pump 300 and the process gas supplier 400 will be described in detail below with FIGS. 2 to 4.

Figure 2:
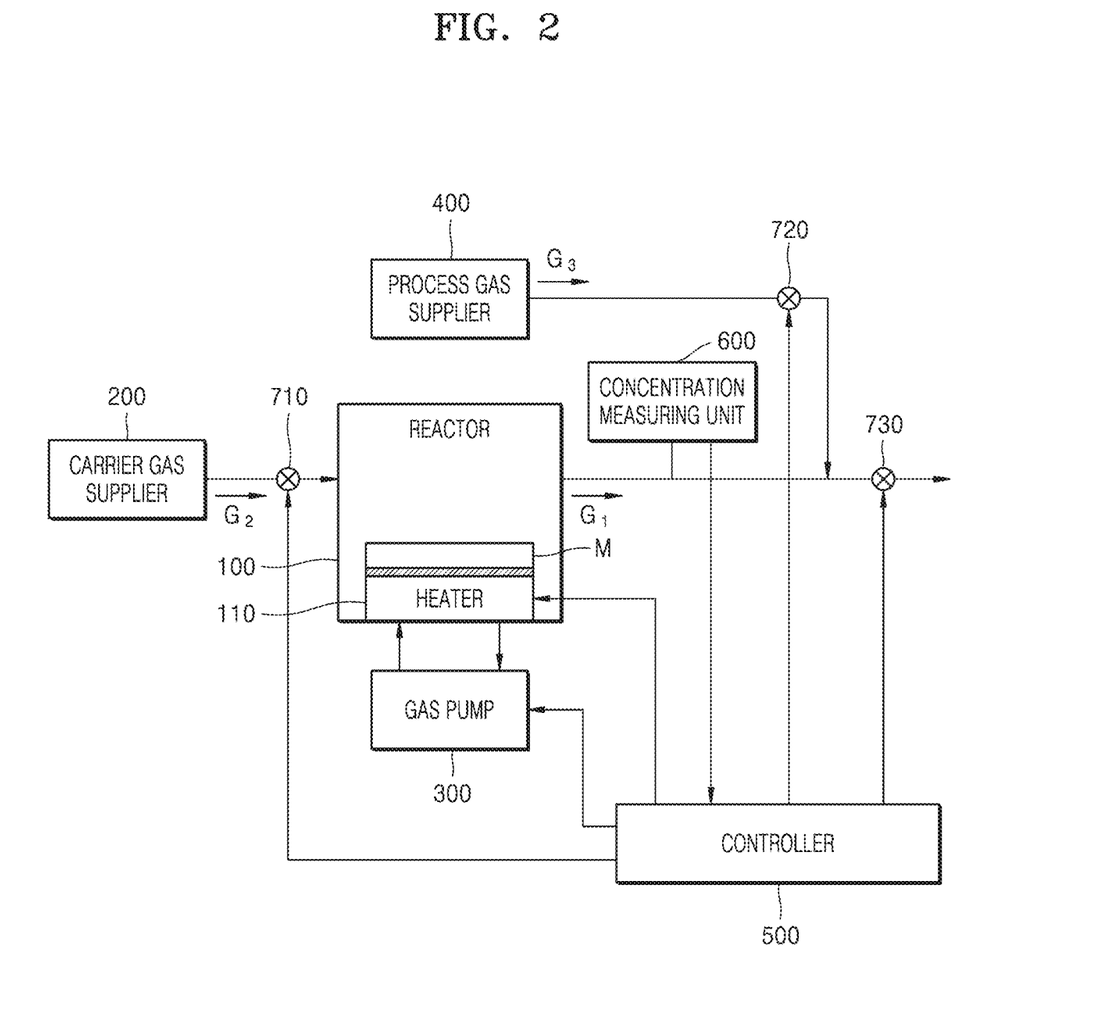
FIG. 2 is a schematic block diagram of an embodiment of a gas supplier.
Figure 3:
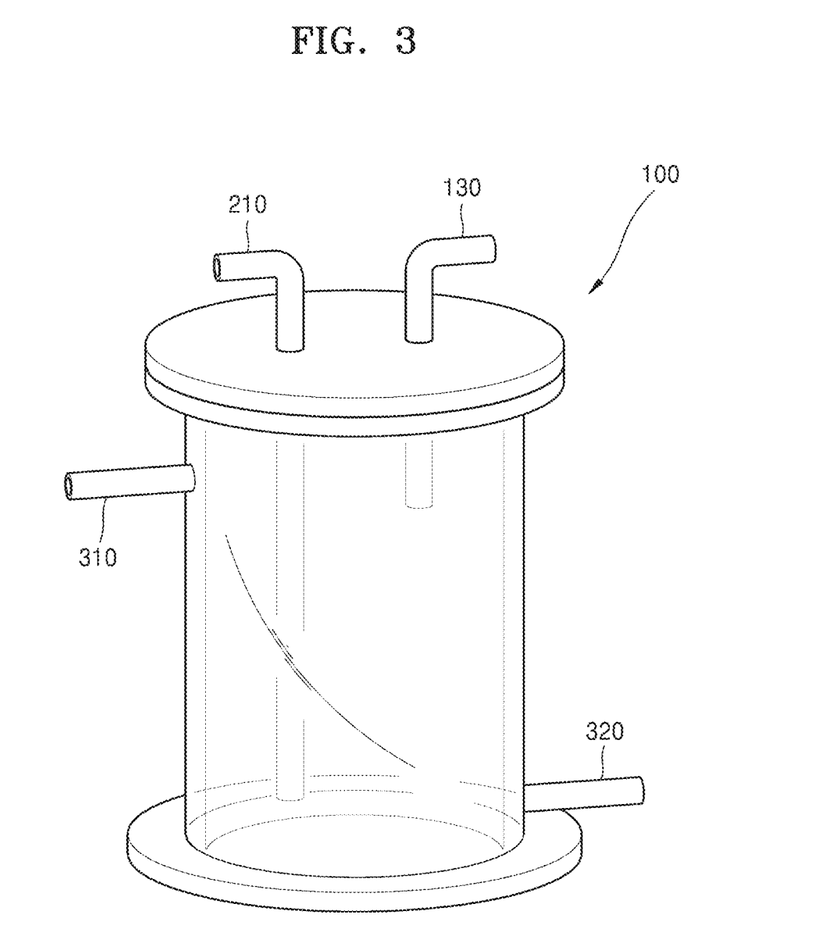
FIG. 3 is a perspective view of an embodiment of a reactor.
Figure 4:
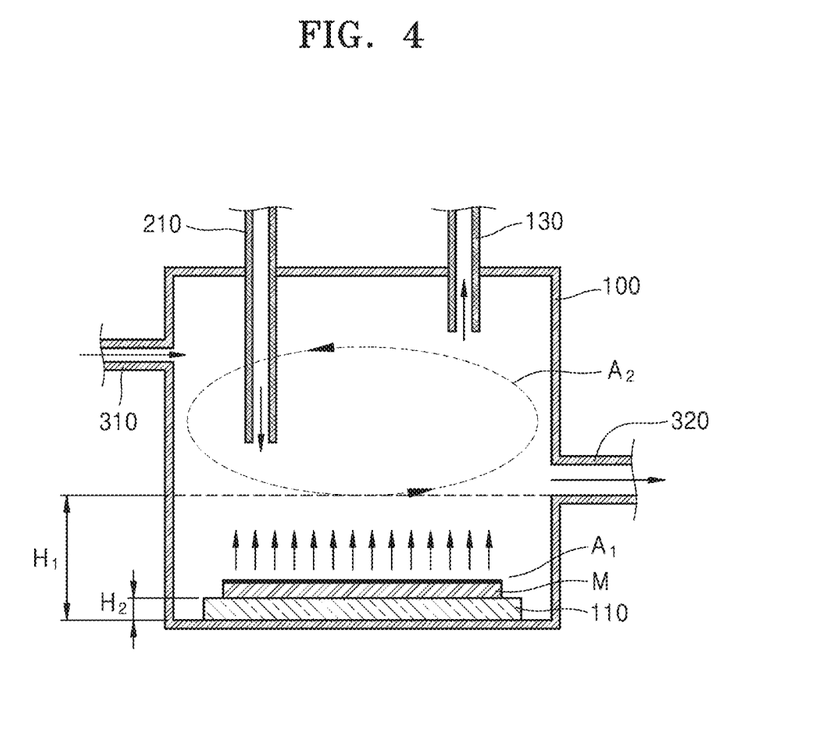
FIG. 4 is a schematic diagram of an embodiment of a reactor.

FIG. 2 is a schematic block diagram of an embodiment of a gas supplier. FIG. 3 is a perspective view of a reactor. FIG. 4 is a schematic diagram of an embodiment of the reactor.

Referring to FIGS. 2 to 4, the gas supplier 10 (refer to FIG. 1) in an embodiment may include a reactor 100 which accommodates a solid phase reactant M, a heater 110 which applies heat to the solid phase reactant M, a gas outlet 130 which discharges a reaction gas G1 to the processor 20 (refer to FIG. 1), a carrier gas supplier 200, a gas pump 300 which applies a predetermined pumping pressure to the reactor 100, a process gas supplier 400, a controller 500, and a concentration measuring unit 600.

The reactor 100 is an accommodation unit which accommodates a reactant M and to provide a space for generating a reaction gas $G_1$ in a gas phase by the solid phase reactant M. In an embodiment, the solid phase reactant M accommodated in the reactor 100 may be any material capable of being vaporized by receiving heat from the heater 110. The reactant M in an embodiment may be provided in powder form to facilitate vaporization. In an embodiment, the reactant M may be any one of a paraformaldehyde in a powder-form, a solid state, and a liquid-state volatile material, for example. The gas outlet 130 may be provided on an upper part of the reactor 100 to discharge the reaction gas $G_1$. In addition, a pumping gas inlet 310 and a pumping gas outlet 320 through which a pumping gas may be introduced and discharged from the gas pump 300 to be described later may be arranged on sides of the reactor 100. However, the invention is not limited thereto, and the arrangement of the gas outlet 130, the pumping gas inlet 310, and the pumping gas outlet 320 may be changed depending on the type of reaction gas $G_1$ and the pumping gas.

The heater 110 is a heat source for applying heat to the reactant M to convert the solid phase reactant M into the reaction gas $G_1$. In an embodiment, the heater 110 may be arranged below the reactor 100, and the reactant M may be arranged above the heater 110. In an embodiment, the heater 110 may be a hot plate that may uniformly apply heat to the reactant M arranged on the heater 110, for example. However, the invention is not limited thereto, and any heating apparatus capable of applying heat to the reactant M may be used. The controller 500 as described below may control the heater 110.

The carrier gas supplier 200 may supply a carrier gas $G_2$ for moving the reaction gas $G_1$ discharged from the reactor 100 to the processor 20. The carrier gas $G_2$ in an embodiment may include an inert gas that does not chemically react with the reaction gas $G_1$. In an embodiment, the carrier gas $G_2$ may include one or more of nitrogen, oxygen, and air. A carrier gas inlet 210 through which a carrier gas $G_2$ may be introduced may be arranged on the upper part of the reactor 100, for example. A first on/off valve 710 for blocking and releasing the supply of the carrier gas $G_2$ may be arranged between the carrier gas supplier 200 and the carrier gas inlet 210. The opening or closing of the first on/off valve 710 may be controlled by the controller 500 to be described later. In an embodiment, when heat is applied to the reactant M by the heater 110, the first on/off valve 710 is controlled to be blocked until the concentration of the reaction gas $G_1$ exceeds a predetermined target concentration, for example. After the concentration of the reaction gas $G_1$ exceeds a predetermined target concentration, the first on/off valve 710 may be released. At this time, the carrier gas $G_2$ may be introduced into an inner side of the reactor 100.

The gas pump 300 may apply a predetermined pumping pressure to the reactor 100. In an embodiment, the gas pump 300 may apply a predetermined pumping pressure to the reactor 100 to relatively uniformly adjust the concentration of the reaction gas $G_1$ arranged inside of the reactor 100. In an embodiment, as shown in FIG. 4, the heater 110 is arranged at a lower part of the reactor 100, and the solid phase reactant M may be heated by receiving heat from the heater 110. Thus, the concentration of the reaction gas $G_1$ sensed at a lower side of the reactor 100 may be greater than the concentration of the reaction gas $G_1$ sensed at an upper side of the reactor 100. In this case, the concentration of the reaction gas $G_1$ discharged through the gas outlet 130 may not be constant.

The gas pump 300 in an embodiment may circulate the reaction gas $G_1$ by applying pumping pressure to an upper region of the reactor 100. At this time, in the upper region where the reaction gas $G_1$ circulates, the concentration of the reaction gas $G_1$ may be relatively uniform. In an embodiment, the interior of the reactor 100 may be distinguished to a non-uniform concentration region $A_1$ of the reaction gas $G_1$ and a uniform concentration region $A_2$ of the reaction gas $G_1$, for example.

In an embodiment, the pumping gas inlet 310 through which a pumping gas supplied from the gas pump 300 is introduced and the pumping gas outlet 320 through which the pumping gas is discharged may be arranged in the reactor 100. At this time, the pumping gas outlet 320 may be arranged at a first height $H_1$ from a lower surface of the reactor 100, the heater 110 may be arranged at a second height $H_2$ from the lower surface of the reactor 100, and the first height $H_1$ may be greater than the second height $H_2$. Accordingly, in a region up to the first height $H_1$ at which the pumping gas outlet 320 is arranged, a non-uniform concentration region $A_1$ of the reaction gas $G_1$ may be formed or provided. That is, in the non-uniform concentration region $A_1$ of the reaction gas $G_1$, the solid phase reactant M is converted into the reaction gas $G_1$ by being applied heat, and thus, the concentration of the reaction gas $G_1$ may be different depending on the location. In a region above the first height $H_1$ at which the pumping gas outlet 320 is arranged, a uniform concentration region $A_2$ of the reaction gas $G_1$ may be formed or provided. That is, in the uniform concentration region $A_2$ of the reaction gas $G_1$, the reaction gas $G_1$ is circulated by pumping pressure applied by the gas pump 300, and thus, the concentration of the reaction gas $G_1$ may be relatively uniformly maintained depending on the position. Therefore, the reaction gas $G_1$ with a uniform concentration may be discharged through the gas outlet 130 arranged in the uniform concentration region $A_2$ of the reaction gas $G_1$.

Also, in an embodiment, the pumping pressure of the gas pump 300 may be controlled by the controller 500. In an embodiment, the controller 500 may adjust the pumping pressure according to the change in the concentration of the reaction gas $G_1$ after receiving a confirmed concentration of the reaction gas $G_1$ from the concentration measuring unit 600 to be described later. In an embodiment, when the concentration of the reaction gas $G_1$ discharged from the reactor 100 changes, the controller 500 increases the pumping pressure to increase the circulation of the reaction gas $G_1$, and accordingly, the concentration of the reaction gas $G_1$ may be controlled to be constant, for example.

The process gas supplier 400 may additionally supply a process gas $G_3$ to be mixed with the reaction gas $G_1$ discharged from the reactor 100. The process gas $G_3$ in an embodiment may include an inert gas that does not chemically react with the reaction gas $G_1$ or any other process gas that may be used in the processor 20. In an embodiment, the carrier gas $G_2$ may include one or more of nitrogen, oxygen, and air. The process gas $G_3$ may be arranged to be mixed with the reaction gas $G_1$ outside the reactor 100. A second on/off valve 720 for blocking and releasing the supply of the process gas $G_3$ may be connected to the process gas supplier 400. The opening or closing of the second on/off valve 720 may be controlled by the controller 500 to be described later.

The controller 500 controls the operation of the heater 110 and the gas pump 300 and may be a device capable of controlling the blocking time and the releasing time of the first to third on/off valves 710, 720, and 730. The controller 500 may include a processor that controls an overall function and operation of the gas supplier 10, a program for the operation of the gas supplier 10, a memory capable of storing necessary data, and a user interface including an input unit and an output unit.

The concentration measuring unit 600 may measure a concentration of the reaction gas $G_1$ discharged from the reactor 100 and then transmitting the concentration information of the reaction gas $G_1$ to the controller 500. Here, the concentration information of the reaction gas $G_1$ refers to information on the concentration of the reaction gas $G_1$ in a gas phase vaporized from the reactant M among the total gas passing through the gas outlet 130. Any measurement device capable of measuring the concentration of the reaction gas $G_1$ in a gas phase may be used in the concentration measuring unit 600.

Figure 5:
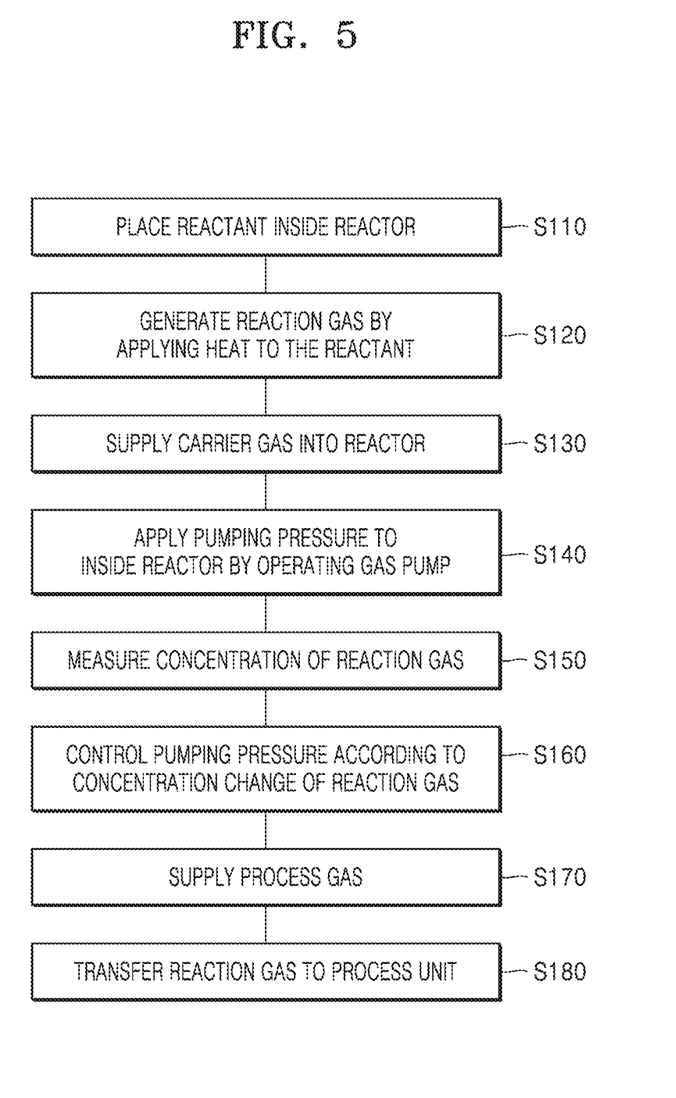
FIG. 5 is a flowchart of an embodiment of a method of operating a process apparatus including a gas supplier.

FIG. 5 is a flowchart of an embodiment of a method of operating a process apparatus including a gas supplier 10.

Referring to FIGS. 1, 2, 4, and 5, a reactant M including one or more of a solid phase and liquid phase volatile material may be disposed in the reactor 100 in an embodiment of operation S110. In an embodiment, the heater 110 may be arranged on the lower part of the reactor 100, and the reactant M may be disposed on the heater 110, for example. The solid phase reactant M disposed in the reactor 100 may be any material capable of receiving heat from the heater 110 and may vaporize. The reactant M in an embodiment may be provided in powder form to facilitate vaporization. In an embodiment, the reactant M may be a paraformaldehyde in a powder-form, for example.

Next, in operation S120 the reaction gas $G_1$ may be generated by applying heat to the reactant M. In an embodiment, when heat is applied to the solid phase reactant M by the heater 110, the reaction gas $G_1$ in a gas phase may be generated by vaporizing the solid phase reactant M, for example. At this time, the inside of the reactor 100 may be sealed until the concentration of the reaction gas $G_1$ exceeds a target concentration. In an embodiment, the first on/off valve 710 connected to the carrier gas supplier 200, the second on/off valve 720 connected to the process gas supplier 400, and the third on/off valve 730 connected to the processor 20 all may be controlled to be blocked by the controller 500, for example.

Next, in operation S130, a carrier gas $G_2$ may be supplied to the reactor 100. In an embodiment, when the concentration of the reaction gas $G_1$ exceeds the target concentration, the carrier gas $G_2$ may be supplied to the inside of the reactor 100, for example. In an embodiment, the blocking of the first on/off valve 710 connected to the carrier gas supplier 200 may be released by the controller 500, and thus, the carrier gas $G_2$ may be supplied to the inside of the reactor 100. The carrier gas $G_2$ in an embodiment may include an inert gas that does not chemically react with the reaction gas $G_1$. In an embodiment, the carrier gas $G_2$ may include one or more of nitrogen, oxygen, and air, for example.

Next, in operation S140, the gas pump 300 may be operated to apply the pumping pressure to the inside of the reactor 100. In an embodiment, the heater 110 is arranged on a lower part of the reactor 100, and the solid phase reactant M may receive heat from the heater 110. Thus, the concentration of the reaction gas $G_1$ sensed at a lower side of the reactor 100 may be greater than the concentration of the reaction gas $G_1$ sensed at an upper side of the reactor 100. In this case, the concentration of the reaction gas $G_1$ discharged through the gas outlet 130 may not be constant. The gas pump 300 in an embodiment may circulate the reaction gas $G_1$ by applying pumping pressure to an upper region of the reactor 100. Accordingly, in the upper region where the reaction gas $G_1$ circulates, the concentration of the reaction gas $G_1$ may be relatively controlled to be uniform.

Next, in operation S150, the concentration of the reaction gas $G_1$ may be measured. In an embodiment, the concentration measuring unit 600 may measure the concentration of the reaction gas $G_1$ discharged from the reactor 100. Here, an object to be measured by the concentration measuring unit 600 is the concentrations of the reaction gas $G_1$ generated by vaporizing from the reactant M. When the concentration of the reaction gas $G_1$ is maintained substantially the same as the target concentration, the concentration measuring unit 600 may transmit the concentration information of the reaction gas $G_1$ to the controller 500. At this time, the controller 500 may transmit a control signal to the gas pump 300 to keep the pumping pressure of the gas pump 300 constant. Also, the reaction gas $G_1$ discharged from the reactor 100 may be transferred to the processor 20.

Next, in operation S160, the pumping pressure may be controlled according to the concentration change of the reaction gas $G_1$. In an embodiment, when the concentration of the reaction gas $G_1$ discharged from the reactor 100 changes differently from the target concentration, the concentration measuring unit 600 may transmit concentration information of the reaction gas $G_1$ to the controller 500. At this time, the controller 500 may transmit a control signal to the gas pump 300 to keep the pumping pressure of the gas pump 300 constant. In an embodiment, when the concentration of the reaction gas $G_1$ is not constant, the controller 500 may control the gas pump 300 so that the pumping pressure of the gas pump 300 is increased, for example.

Next, in operation S170, a process gas $G_3$ may be supplied (to the processor 20). In an embodiment, the process gas $G_3$ to be mixed with the reaction gas $G_1$ discharged from the reactor 100 is additionally supplied (to the processor 20). The process gas $G_3$ in an embodiment may include an inert gas that does not chemically react with the reaction gas $G_1$ or any other process gas that may be used in the processor 20. In an embodiment, the carrier gas $G_2$ may include one or more of nitrogen, oxygen, and air, for example. The second on/off valve 720 for blocking and releasing the supply of the process gas $G_3$ may be connected to the process gas supplier 400. Depending on whether the process gas $G_3$ is desired or not, the controller 500 may control whether the second on/off valve 720 is opened or closed.

Next, in operation S180, the reaction gas $G_1$ may be transferred to the processor 20. In an embodiment, the reaction gas $G_1$ having a uniform concentration may be transferred to the processor 20. Therefore, a predetermined process may be performed by the reaction gas $G_1$.

Figure 6:
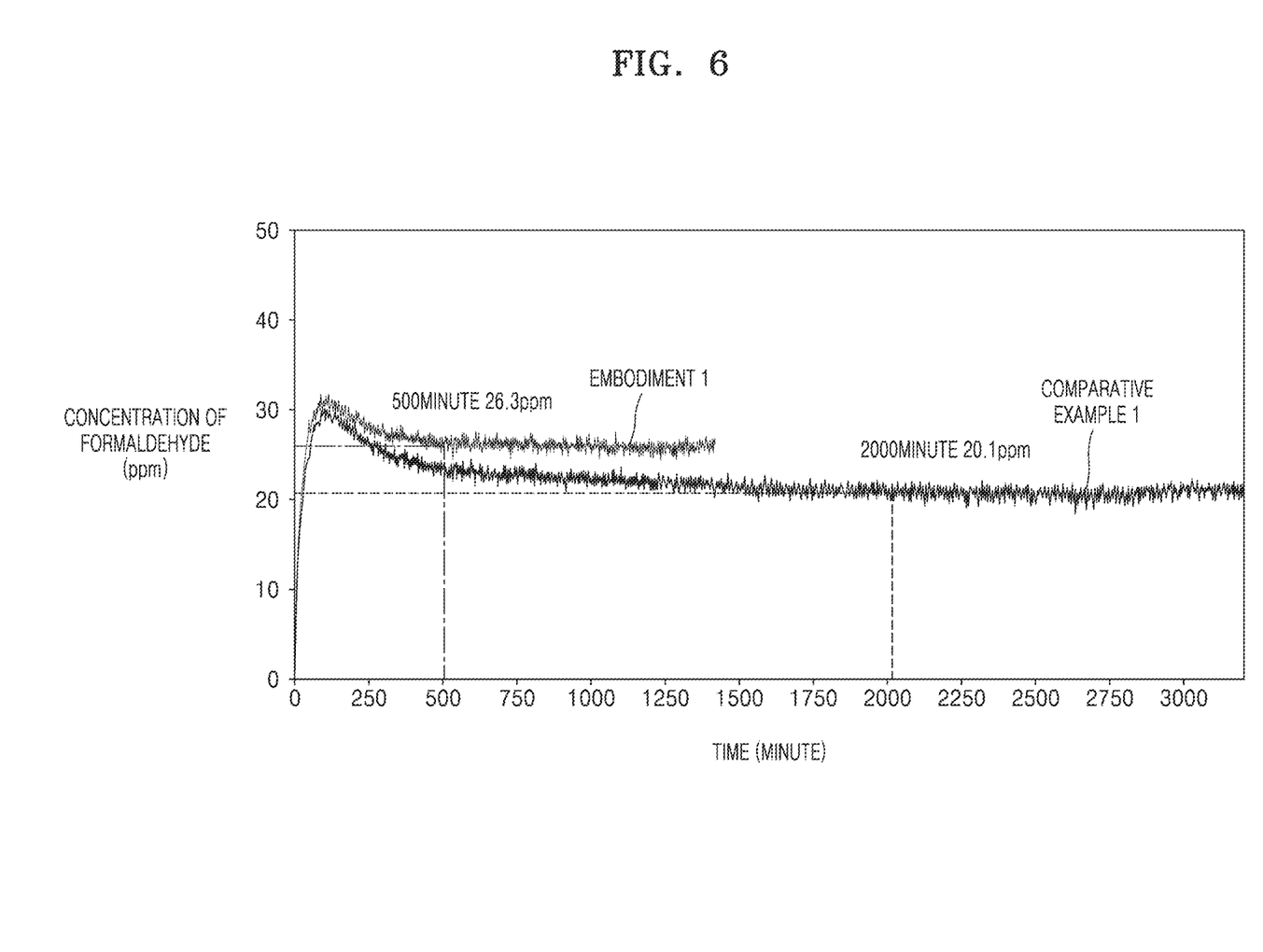
FIG. 6 is a graph showing concentration change of a reaction gas according to time according to Embodiment 1 and Comparative Example 1.

FIG. 6 is a graph showing a concentration change of a reaction gas according to time according to Embodiment 1 and Comparative Example 1.

Embodiment 1

As a reactant M, 3 grams (g) of paraformaldehyde is placed inside a reactor 100 having a volume of 1 liter (L), and the reactor 100 is heated to about 40 degrees Celsius (° C.) using a heater 110. At this time, both the first on/off valve 710 and the third on/off valve 730 maintain a blocked state, and accordingly, the inside of the reactor 100 is maintained in a sealed state. Thereafter, the first on/off valve 710 is opened to supply nitrogen $N_2$ corresponding to a carrier gas $G_2$ at a flow rate of about 20 milliliters per minute (ml/min). The gas pump 300 applies pumping pressure to an inside of the reactor 100 by air at a flow rate of about 3 liters per minute (L/min).

COMPARATIVE EXAMPLE 1

The remaining configurations except the gas pump 300 are the same as those of Embodiment 1.

Referring to FIG. 6, in a state that both the first on/off valve 710 and the third on/off valve 730 are blocked, in Embodiment 1 and Comparative Example 1, it is seen that the concentration of the formaldehyde gas, which is the reaction gas $G_1$ in which the reactant M is vaporized, rapidly increases. Thereafter, the concentration of formaldehyde gas is lowered as the first on/off valve 710 is opened and the carrier gas $G_2$ is supplied. At this time, when a pumping pressure is applied to the inside of the reactor 100 by the gas pump 300, it may be seen that, in Embodiment 1, after about 500 minutes, the concentration of formaldehyde gas is maintained constant at a concentration of about 26.3 parts per million ("ppm"), but in Comparative Example 1, after about 2000 minutes, the concentration of the formaldehyde gas is maintained constant at a concentration of about 20.1 ppm. That is, when the gas pump 300 is not arranged, it may be seen that it takes 4 times longer to maintain the concentration of the reaction gas constant.

Figure 7:
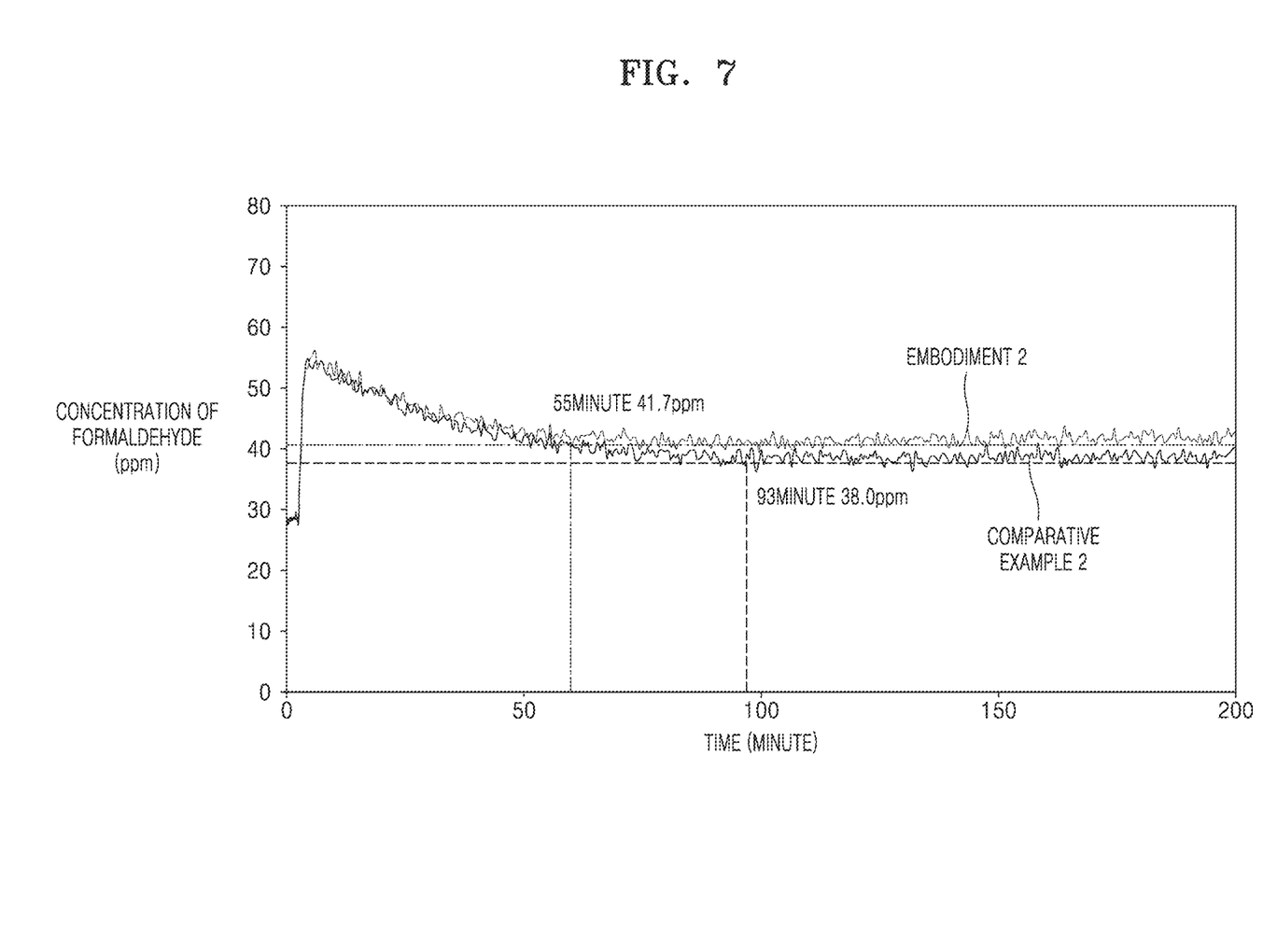
FIG. 7 is a graph showing concentration change of a reaction gas according to time according to Embodiment 2 and the time according to Comparative Example 2.

FIG. 7 is a graph showing the concentration change of a reaction gas according to time according to Embodiment 2 and according to Comparative Example 2.

Embodiment 2

As a reactant M, 3 g of paraformaldehyde is placed inside a reactor 100 having a volume of 1 L and the reactor 100 is heated to about 40° C. using a heater 110. At this time, both the first on/off valve 710 and the third on/off valve 730 maintain a blocked state, and accordingly, the inside of the reactor 100 is maintained in a sealed state. Thereafter, the first on/off valve 710 is opened to supply nitrogen $N_2$ corresponding to a carrier gas $G_2$ at a flow rate of 40 ml/min. The gas pump 300 applies pumping pressure to an inside of the reactor 100 by air at a flow rate of about 3 L/min.

COMPARATIVE EXAMPLE 2

The remaining configurations except the gas pump 300 are the same as those of Embodiment 2.

Referring to FIG. 7, in a state that both the first on/off valve 710 and the third on/off valve 730 are blocked, in Embodiment 2 and Comparative Example 2, it is seen that the concentration of the formaldehyde gas, which is the reaction gas $G_1$ in which the reactant M is vaporized, rapidly increases. Thereafter, the concentration of formaldehyde gas is lowered as the first on/off valve 710 is opened and the carrier gas $G_2$ is supplied. At this time, when a pumping pressure is applied to the inside of the reactor 100 by the gas pump 300, it may be seen that, in Embodiment 2, after about 55 minutes, the concentration of formaldehyde gas is maintained constant at a concentration of about 41.7 ppm, but in Comparative Example 2, after about 93 minutes, the concentration of the formaldehyde gas is maintained constant at a concentration of about 38.0 ppm. That is, when the gas pump 300 is not arranged, it may be seen that it takes 1.7 times longer to maintain the concentration of the reaction gas constant. In addition, it may be seen that, as the flow rate of the carrier gas $G_2$ increases, the time for which the concentration of the formaldehyde gas is maintained constant is reduced compared to Embodiment 1 and Comparative Example 1.

While numerous features have been specifically described in the above description, they should be interpreted as examples of preferred embodiments rather than limiting the scope of the invention. It will be understood by those skilled in the art that a process apparatus including a gas supplier described above and a method of operating the process apparatus including the gas supplier may be modified in various ways, for example. Therefore, the scope of the invention is defined not by the detailed description of the invention but by the appended claims.

A process apparatus including a gas supplier capable of supplying a reaction gas of a constant concentration and a method of operating the process apparatus may be provided. A process apparatus including a gas supplier having a reduced volume and ensuring convenience in manufacturing and accommodation and a method of operating the process apparatus including the gas supplier may be provided.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A process apparatus comprising:
    a gas supplier which supplies a reaction gas having a constant concentration, the gas supplier including:
        a reactor which accommodates a solid phase reactant;
        a heater which applies heat to the solid phase reactant to convert the solid phase reactant to the reaction gas in a gas phase;
        a gas pump which applies a predetermined pumping pressure to the reactor; and
        a gas outlet which discharges the reaction gas; and
    a processor which performs a predetermined process by the reaction gas supplied from the gas outlet of the gas supplier to the processor.

2. The process apparatus of claim 1, wherein the solid phase reactant comprises at least one of a solid phase and liquid phase volatile material.

3. The process apparatus of claim 1, further comprising a concentration measuring unit which measures the constant concentration of the reaction gas discharged from the reactor.

4. The process apparatus of claim 3, further comprising a controller which controls the predetermined pumping pressure of the gas pump according to a concentration change of the reaction gas received from the concentration measuring unit.

5. The process apparatus of claim 1, further comprising a carrier gas supplier which supplies a carrier gas which moves the reaction gas discharged from the reactor to the processor.

6. The process apparatus of claim 5, wherein the carrier gas includes at least one of nitrogen, oxygen, and air.

7. The process apparatus of claim 5, further comprising:
- a first on/off valve which blocks and releases the supply of the carrier gas; and
- a controller which controls the first on/off valve.

8. The process apparatus of claim 1, wherein the reactor includes a pumping gas inlet through which a pumping gas supplied from the gas pump is introduced and a pumping gas outlet through which the pumping gas is discharged.

9. The process apparatus of claim 8, wherein
- the pumping gas outlet is arranged at a first height from a surface of the reactor on which the heater is disposed, and the heater is arranged at a second height from the surface of the reactor, and
- the first height is greater than the second height.

10. The process apparatus of claim 1, further comprising a process gas supplier which supplies a predetermined process gas to be mixed with the reaction gas discharged from the reactor.

11. The process apparatus of claim 10, wherein the predetermined process gas comprises at least one of nitrogen, oxygen, and air.

12. The process apparatus of claim 10, further comprising:
- a second on/off valve which blocks and releases the supply of a process gas; and
- a controller which controls the second on/off valve.

* * * * *